INVENTOR
ICHIRO IMAIZUMI

BY Craig & Antonelli
ATTORNEYS

INVENTOR
ICHIRO IMAIZUMI

BY Craig & Antonelli
ATTORNEYS

United States Patent Office 3,449,643

Patented June 10, 1969

3,449,643

SEMICONDUCTOR INTEGRATED CIRCUIT DEVICE

Ichiro Imaizumi, Tokyo, Japan, assignor to Hitachi, Ltd., Tokyo, Japan, a corporation of Japan Filed Sept. 8, 1967, Ser. No. 666,353
Claims priority, application Japan, Sept. 9, 1966, 41/59,172
Int. Cl. H01l *11/00, 19/00*
U.S. Cl. 317—235 8 Claims

ABSTRACT OF THE DISCLOSURE

A semiconductor integrated circuit device having a structure wherein, a first and a second N type separated regions of epitaxial layer are formed on a common P type semiconductor substrate to cover respectively an N type and a P type buried region which are buried in the substrate with high impurity concentration, a P type and an N-type diffused regions are provided by double diffusion in the first separated region so that the first separated region incorporated with the N type buried region, and the P type and N type diffused regions form the collector, base andemitter of an NPN transistor substructure respectively, and another P type diffused region is provided in the second separated region so that the P type semiconductor substrate, the N type second separated region, and said P type diffused region form the collector, base, and emitter of a PNP transistor substructure respectively.

As a result of P type impurity diffusion from the P type buried region into the second N type separated region, a part of said second N type separated region is converted into P type, thereby the PNP transistor structure with a small base width is provided.

*Background of the invention*

This invention relates to a semiconductor device, and more particularly it pertains to a semiconductor integrated circuit device having PNP type and NPN type transistor structures incorporated in a common semiconductor substrate.

In such a semiconductor integrated circuit device having a PNP transistor and an NPN type transistor incorporated in a common semiconductor substrate, for the convenience of fabrication, only one type of the transistors, for example, only the NPN transistor is so constructed as to be electrically independent of the semiconductor substrate, while the other type of transistor namely the PNP type one is so constructed as to enable said semiconductor substrate to serve as the collector region thereof so that it is electrically coupled to said substrate.

More specifically, in a semiconductor integrated circuit device having such construction as described above, the NPN type transistor structure thereof is such that an N type epitaxial layer is provided on the surface of a semiconductor substrate which is normally of P conductivity type, a portion of said epitaxial layer is surrounded by a PN junction so as to be at least one N type separated surface region which is separated from the remaining portion of said epitaxial layer, said N type separated surface region serves as the collector region, a P type surface diffused region formed by initially diffusing a P type impurity into the surface portion of said N type separated surface region serves as the base region, and an N type surface diffused region formed by diffusing an N type impurity into the surface portion of said base region serves as the emitter region. In the PNP type transistor structure, on the other hand, said P type semiconductor substrate serves as the collector region, said epitaxial layer except for said separated surface region formed on said substrate serves as the base region, and a P type surface diffused region simultaneously formed by said initial diffusion of the P type impurity serves as the emitter region.

In this case, said N type separated surface region is formed by an epitaxial layer with a low impurity concentration and a relatively high resistance, as described Therefore, in the NPN type transistor using said N type separated surface region as the collector region thereof, it is required that an N type buried region with a high impurity concentration be formed in that predetermined surface portion of the semiconductor substrate on which is formed said N type separated surface region in such a manner that it is disposed into contact with the bottom surface of the N type separated surface region, normally for the purpose of decreasing the equivalent resistance of the collector. In this case, it is desired that the buried region be as stably positioned as possible. Therefore, such buried region should normally be formed by an impurity capable of representing a low diffusion constant and a high impurity concentration. For this reason, arsenic is used as buried impurity. Thus, such buried region is formed in a predetermined surface portion of the semiconductor substrate by diffusing arsenic thereinto, and thereafter an epitaxial layer is formed which is to constitute said N type separated surface region.

However, in an attempt to fabricate a semiconductor integrated circuit device as described above, heat treatment is required for such purposes as the formation of said epitaxial layer and an oxide layer, diffusion of impurities or the like, and therefore diffusion of the buried impurity contained in said buried region is inevitably effected during said heat treatment, with a result that a highly concentrated region of said buried impurity with a thickness of about 2 to 3$\mu$ is formed in the N type separated surface region disposed in contact with said buried region. Therefore, if the base region of the NPN type transistor is made too deep, there may occur such trouble as that the base-collector junction surface is caused to be in contact with said highly concentrated region so that the breakdown voltage of the transistor is decreased. This means that a certain limitation is imposed upon the base width of the PNP type transistor of which the emitter region is formed by the P type surface diffused region formed simultaneously with the base region of said NPN transistor through the impurity diffusion with respect to the latter. Thus, in a conventional semiconductor integrated circuit device, especially a PNP transistor with a small base width could not be fabricated, which lead to inconveniences in respect of circuit design.

Accordingly, it is a primary object of the present invention to minimize the base width of a transistor structure incorporated in such a semiconductor integrated circuit device, wherein the collector region is constituted by the semiconductor substrate of said integrated circuit device, and the base region is formed by an epitaxial layer formed on said semiconductor substrate.

Another object of this invention is to provide a semiconductor integrated circuit structure adapted for facilitating the separation diffusion of an impurity which is effected from the surface of an epitaxial layer so as to form a separated region in part of said epitaxial layer.

The semiconductor integrated circuit structure of this invention which is capable of achieving the afore-mentioned objects is characterized in that the transistor of which the collector is formed by the semiconductor substrate includes an impurity buried region provided in a predetermined surface portion of the semiconductor substrate serving as the collector region thereof, said impurity buried region being formed by doping an impurity with a high density which is of the same conductivity type as that of said semiconductor substrate.

The foregoing and other objects, features and advantages of the present invention will become apparent from the following description taken in conjunction with the accompanying drawings.

*Description of preferred embodiments*

Figure 1:
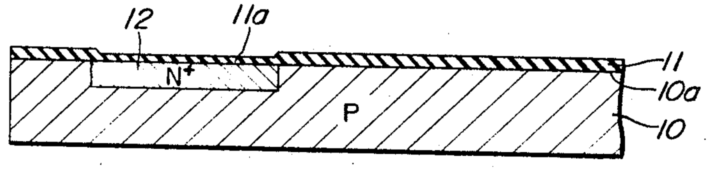
FIGS. 1 through 6 are sectional views illustrating an embodiment of the present invention, in the order of the steps of fabrication thereof, respectively.

Referring to FIG. 1 of the drawings, the reference numeral 10 represents a monocrystalline silicon substrate of P conductivity type which is silicon wafer 200 to 250$\mu$ in thickness with an impurity concentration of $10^{15}$ cm.$^{-3}$, a resistivity of 5 to 10 Ωcm. and having a silicon dioxide film 11 about 8,000 A. in thickness previously formed on a surface 10*a* thereof. In FIG. 1, is shown the state that an N type region 12 is formed by the diffusion of arsenic, which is a donor impurity, through a hole formed by removing a predetermined portion 11*a* of said oxide film 11. Said N type region 12 is intended to serve as a buried region which has a high impurity concentration as indicated by $N^+$ in the drawing. For example, the impurity concentration in the surface portion of the N type region 12 is $10^{19}$ to $10^{20}$ cm.$^{-3}$, and the depth thereof is about 4$\mu$. A silicon dioxide film is reformed on the N type region during the diffusion with respect to the N type region.

Figure 2:
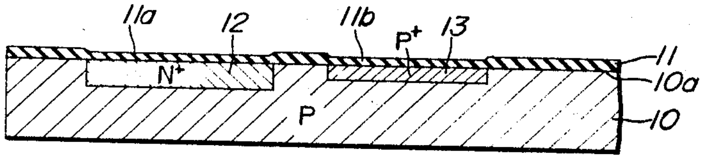

In accordance with the present invention, a hole 11*b* is formed in said silicon dioxide film 11 at a position remote from said N type buried region 12, and a P type buried region 13 with a surface impurity concentration of $10^{18}$ cm.$^{-3}$ and a depth of about 1$\mu$ is formed by diffusing boron, which is an acceptor impurity, through the use of the oxide film formed with the hole 11*b* as mask, as shown in FIG. 2.

Figure 3:
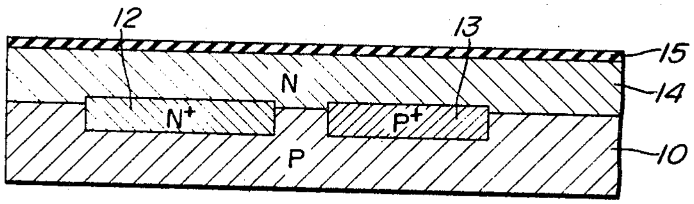

Thereafter, the oxide film 11 is completely removed. FIG. 3 shows the state wherein an N type epitaxial layer 14 with a resistivity of 0.1 Ωcm. and a thickness of 5.5$\mu$ is formed on the surface 10*a* of the silicon substrate 10 through vapor-phase growth and a silicon dioxide film 15 with a thickness of about 8,000 A. is formed on the surface of said epitaxial layer 14. This N type epitaxial layer 14 can be formed through application of the well-known vapor-phase growth technique. For example, such N type epitaxial layer may be formed by heating the silicon substrate 10 at 1200° C. for several minutes in an atmosphere of silicon tetrachloride ($SiCl_4$) and hydrogen gas doped with boron which is an N type impurity.

Since the silicon substrate 10 is heated at such a high temperature as about 1150° C. for one hour or longer when the oxide film 15 is formed on the surface of the epitaxial layer 14, the N type and the P type buried regions 12, 13 which have already been buried in said silicon substrate 10 are caused to extend to some degree into the adjacent N type epitaxial layer 14 due to the diffusion of their buried impurities, as shown in the drawing.

Figure 4:
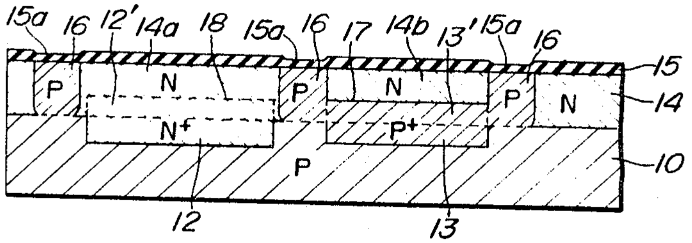

Subsequently, a portion 15*a* of said surface oxide film 15 is removed in a frame-like shape, and a P type impurity or boron is diffused from the exposed surface of the N type epitaxial layer to such an extent as to reach the substrate 10, thereby dividing said N type epitaxial layer into N type separated regions 14*a* and 14*b*, as shown in FIG. 4. Such separation diffusion is effected by first heating the silicon substrate at 1150° C. for 40 minutes, depositing boron with a surface density of about $10^{20}$ cm.$^{-3}$ on that surface portion of the epitaxial layer which is exposed through the portion where the oxide film is removed, and thereafter heating the substrate 10 at 1100° C. for one hour or longer so that said deposited boron is permitted to penetrate through the epitaxial layer 14 to reach the substrate thereby forming a P type separating region 16.

During these heat treatments, the buried impurities contained in said buried regions 12 and 13 are caused to further diffuse and penetrate into the adjacent N type epitaxial layer 14, with a result that a highly concentrated N type impurity region 12' is formed in the N type separated region 14*a* and a P type inversion region 13' is formed in the other N type separated region 14*b*, said P type inversion region being formed as a result of the reversal of the conductivity type of the N type separated region 14*b* to P type which is caused by the diffusion of the P type buried impurity contained in the buried region 13 thereinto. The formation of such a P type inversion region 13' makes said N type separated region 14*b* as thin as about 2$\mu$. since the P type buried impurity or boron has a large diffusion constant as compared with the N type buried impurity or arsenic, the bottom surface 17 of said N type separated region 14*b* is located at a shallower position than the upper end surface 18 of said highly concentrated N type region 12'.

Figure 5:
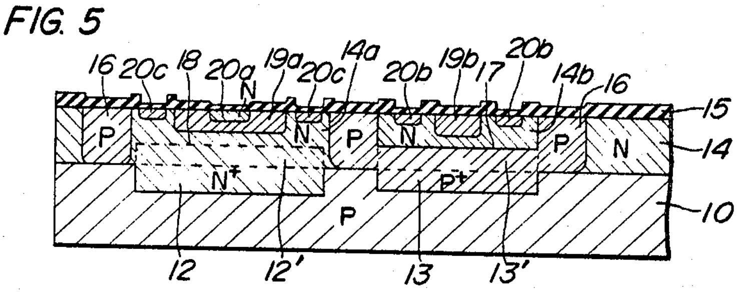

Therefore, by forming P type surface diffused regions 19*a* and 19*b* respectively in the N type separated regions 14*a* and 14*b* by diffusing the P type impurity or boron from their surfaces thereinto at the concurrent impurity diffusion step as shown in FIG. 5, it is possible to locate the P type surface diffused region 19*b* at a position sufficiently close to the bottom face 17 of the N type separated region 14*b* while preventing the other P type surface diffused region 13*a* from contacting the upper end face 18 of said highly concentrated region 12'. Assume that the depth of diffusion of the P type surface diffused regions 19*a* and 19*b* is 1.5$\mu$, for example, then a PNP transistor structure wherein the emitter region is formed by the P type surface diffused region 19*b*, the base region by the N type separated region 14*b* and the collector region by the P type silicon substrate 10 and P type region 13, 13' will possess a base width as small as 0.5$\mu$. Thereafter, by forming an N type surface diffused region 20*a* in the surface portion of the P type surface diffused region 19*a* by diffusing an N type impurity such as, for example, phosphorus thereinto, it is possible to construct an NPN type transistor structure wherein the emitter region is formed by said N type surface diffused region 20*a*, the base region by the P type surface diffused region 19*a* and the collector region by the separated region 14*a* consisting of the N type epitaxial layer. This can be performed in a manner similar to the fabrication of the conventional double-diffusion type transistor, and the base width can readily be made as small as 0.3 to 0.8$\mu$.

When said N type surface diffused region 20*a* is formed, regions 20*b* and 20*c* are simultaneously formed in the surface portions of the N type separated regions 14*b* and 14*a* consisting of the epitaxial layer by diffusing the N type impurity into said surface portions, respectively. These diffused regions are used to attach electrodes to said separated regions.

Figure 6:
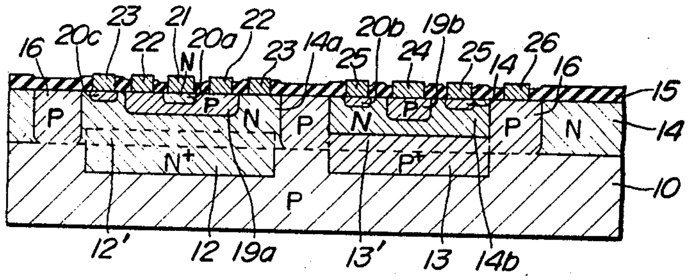

FIG. 6 shows the state wherein emitter, base and collector electrode terminals 21, 22, 23, 24, 25 and 26 are attached to the transistor substructures of thus fabricated semiconductor integrated circuit device by evaporating aluminum thereonto.

From the foregoing, it will be seen that in accordance with the present invention, especially the base width of the PNP type transistor structure can readily be reduced so that the current gain thereof is increased. In accordance with this invention, said P type buried region can very conveniently be used for the separation diffusion with respect to the epitaxial layer.

Figure 7:
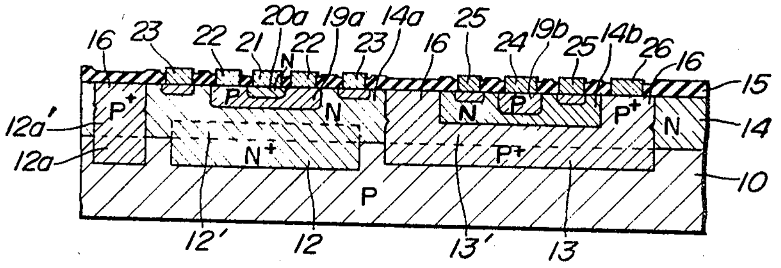
FIG. 7 is a sectional view showing another embodiment of the present invention.

If a P type buried region 12*a* is also provided on the surface of the silicon substrate 10 especially at the position where the separation diffusion is to be effected, as shown in FIG. 7, then the buried impurity of the buried regions will be caused to diffuse from their bottom faces into the N type epitaxial layer 14. Thus the P type impurity is permitted to diffuse into said N type epitaxial layer 14 from the opposite faces thereof, and the diffusion of the P type impurity from the surface of the layer 14 can be effected at such a depth as to contact a P type separating region 12*a'* formed by the diffusion of the buried impurity from said P type buried regions 12*a'*, so that the period of time required for the separation diffusion can be shortened. In this case, in order to form the N type separated region 14*b* which is to serve as the base of the PNP transistor, the separation diffusion effected from the surface of the N type epitaxial layer is performed to such an extent to contact the P type inversion region 13' formed by the diffusion of the buried impurity from the P type buried region 13.

In FIG. 7, parts corresponding to those of FIG. 6 are indicated by like reference numerals.

In the foregoing, description has been made of the semiconductor integrated circuit device incorporating the NPN transistor structure formed on the P type semiconductor substrate in such a manner that it is electrically isolated from said substrate, and the PNP transistor structure connected with the substrate wherein the latter serves as the collector region, emphasizing that the PNP type transistor is improved by providing the P type buried region on said PNP transistor side. However, it is to be understood that this invention is not limited to the structures according to the embodiments described herein. It will readily occur to those skilled in the art that the present invention can equally be applied to a semiconductor device using an N type substrate, which includes an NPN type transistor of which the collector region is formed by the substrate, for example.

I claim:

1. A semiconductor integrated circuit device comprising:

(a) a semiconductor substrate of a first conductivity type having a major face;

(b) a first semiconductive buried region of a second conductivity type opposite to said first conductivity type buried in said substrate adjacent to the major face thereof at a predetermined zone with high impurity density;

(c) a second semiconductive buried region of a first conductivity type buried in said substrate adjacent to the major face thereof at a predetermined zone different from said first buried region with high impurity density;

(d) a semiconductor epitaxial layer of the second conductivity type grown on the major face of said substrate; said first buried region being extended in said epitaxial layer thereby forming a highly concentrated region of the second conductivity type impurity at the bottom portion thereof, said second buried region being extended in said epitaxial layer thereby forming an inversion region of the first conductivity type at the bottom portion thereof;

(e) at least one semiconductive separating region of the first conductivity type diffused through said epitaxial layer to reach any first conductivity type region underlaying said epitaxial layer so as to divide said epitaxial layer into at least its first portion in which said highly concentrated region is included and its second portion in which said inversion region is included and which is isolated from said first portion;

(f) a first surface diffused region of the first conductivity type diffused in the first portion of said epitaxial layer;

(g) a second surface diffused region of the second conductivity type diffused in said first surface diffused region thereby forming a first transistor structure with said first portion of said epitaxial layer and said first and second surface diffused regions which serve respectively as the collector, base and emitter; and (h) a third surface diffused region of the first conductivity type diffused in said second portion of the epitaxial layer thereby forming a second transistor structure different in type from that of said first transistor structure with said substrate, said second portion of the epitaxial layer and said third surface diffused region which serve respectively as the collector, base and emitter.

2. A semiconductor integrated circuit device according to claim 1, wherein said semiconductive separating region of the first conductivity type is integrally contacted with said substrate.

3. A semiconductor integrated circuit device according to claim 1, wherein said semiconductive separating region of the first conductivity type for dividing said second portion of the epitaxial layer from the other portion thereof is integrally contacted with said second semiconductive buried region.

4. A semiconductor integrated circuit device according to claim 1, wherein the degree of extension of the first buried region is relatively smaller than that of said second buried region.

5. A semiconductor integrated circuit device according to claim 1, wherein said first and second buried region are formed in said substrate respectively by doping impurity from the major face thereof prior to grow said epitaxial layer.

6. A semiconductor integrated circuit device according to claim 1, further including at least one semiconductive buried region of a first conductivity type buried in said substrate adjacent to the major face thereof positioning under said semiconductive separating region of the first conductivity type with high impurity density, which being extended in said epitaxial layer thereby forming an inversion region of the first conductivity type in said epitaxial layer from bottom thereof, said semiconductive separating region is integrally contacted with said inversion region within said epitaxial layer.

7. A semiconductor integrated circuit device according to claim 1, wherein the first transistor structure is NPN type, and the second transistor structure is PNP type.

8. A semiconductor integrated circuit device according to claim 4, wherein the first conductivity type is P type and the second conductivity type is N type, said first buried region is formed by arsenic doping, and said second buried region is formed by boron doping.

References Cited

UNITED STATES PATENTS

| | | | |
|---|---|---|---|
| 3,327,182 | 6/1967 | Kisinko | 317—235 |
| 3,335,341 | 8/1967 | Lin | 317—235 |

JOHN W. HUCKERT, *Primary Examiner.*

J. D. CRAIG, *Assistant Examiner.*

U.S. Cl. X.R.

148—175